United States Patent [19]

Woodworth et al.

[11] Patent Number: 4,636,736

[45] Date of Patent: Jan. 13, 1987

[54] VARIABLE PHASE SIGNAL DEMODULATOR

[75] Inventors: Donald J. Woodworth; Gregory A. Magin, both of Ocala, Fla.

[73] Assignee: Microdyne Corporation, Ocala, Fla.

[21] Appl. No.: 634,642

[22] Filed: Jul. 26, 1984

Related U.S. Application Data

[63] Continuation of Ser. No. 311,114, Oct. 13, 1981, abandoned.

[51] Int. Cl.$^4$ .......................... H03D 1/04; H02L 7/12
[52] U.S. Cl. ...................................... 329/50; 329/101; 329/122; 331/4; 331/17; 331/23; 331/DIG. 2; 455/245; 455/260; 455/265
[58] Field of Search ........................ 329/50, 122, 101; 331/4, 17, 23, DIG. 2; 455/234, 245, 260, 265

[56] References Cited

U.S. PATENT DOCUMENTS

| | | | |
|---|---|---|---|
| 3,958,186 | 5/1976 | Jesse et al. | 331/4 |
| 4,007,429 | 2/1977 | Cadalora et al. | 331/17 |
| 4,077,015 | 2/1978 | Carson et al. | 331/4 |
| 4,206,420 | 6/1980 | Querry et al. | 331/4 |

Primary Examiner—Siegfried H. Grimm
Attorney, Agent, or Firm—Hall, Myers & Rose

[57] ABSTRACT

A dual conversion variable bandwidth telemetry receiver employs a phase locked loop which controls the second local oscillator to maintain lock on the carrier frequency; the phase locked loop employing a loop filter with a variable time constant integrator, the time constant of which can be varied as a function of receiver bandwidth and the integrator with its associated capacitor and resistor banks being employed in a sweep, i.e. search, oscillator circuit enabled when the carrier signal is lost. A coherent double-balanced mixer is employed to detect carrier lock and if lock is lost but the carrier is still detected, a rapid response anti-sideband circuit in the phase detector of the phase locked loop is employed to suppress the sidebands and greatly increase the probability of relocking on the carrier. A synchronous AM detector employs quadrature IF and reference signals at the same frequency to produce a dc signal when phase lock occurs; the signal falling rapidly upon loss of lock. The synchronous AM detector employs a variable time constant integrator for eliminating noise above a low frequency to accommodate carrier fading, said integrator being located in an AGC circuit of an amplifier feeding a balanced mixer to hold the IF at a constant level, thus permitting detection of carrier signals at a carrier to noise ratio as low as a −20 dB. The AM detector also produces a substantially exact reproduction of the AM signal for use elsewhere in the receiver.

15 Claims, 9 Drawing Figures

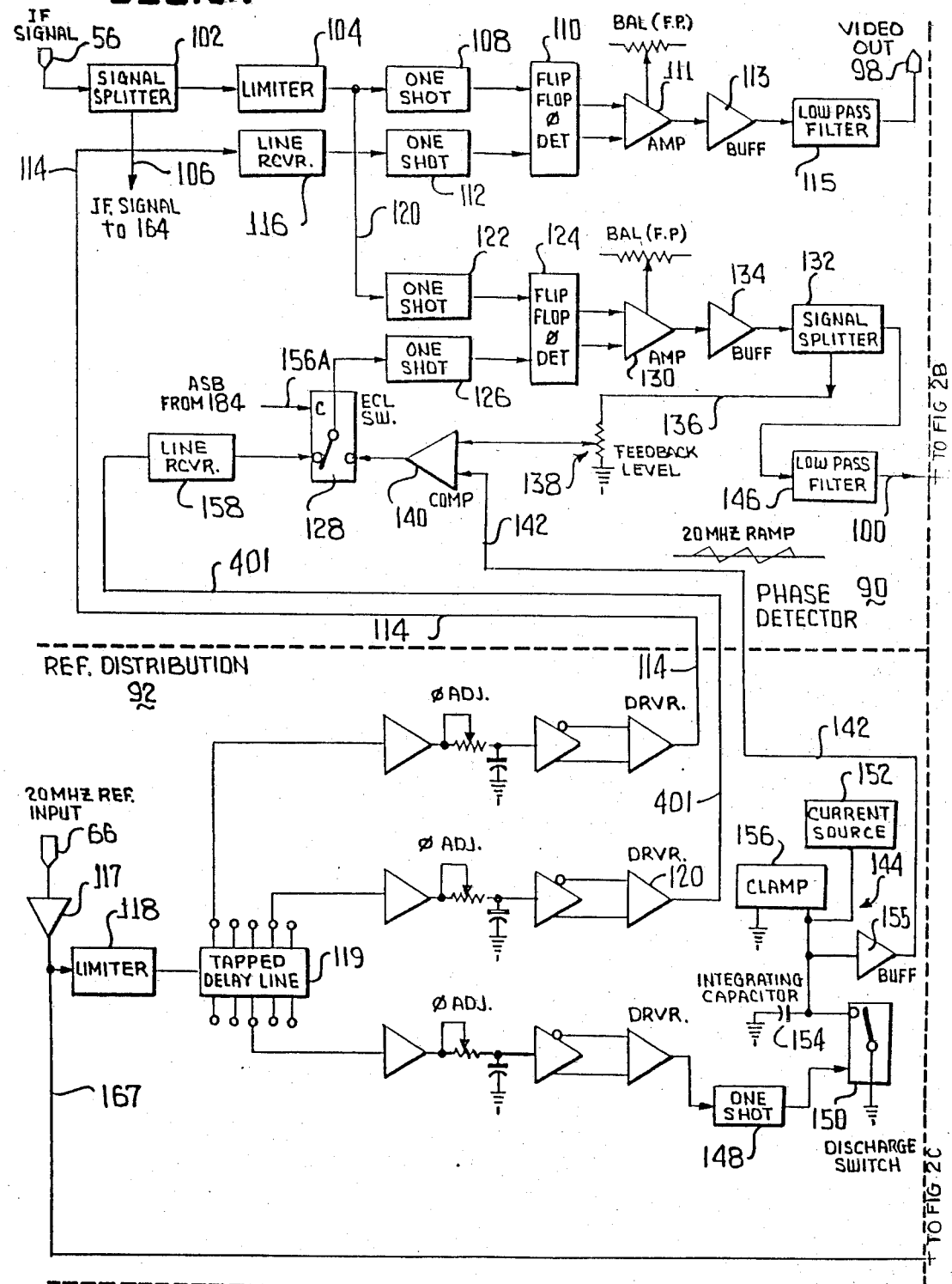

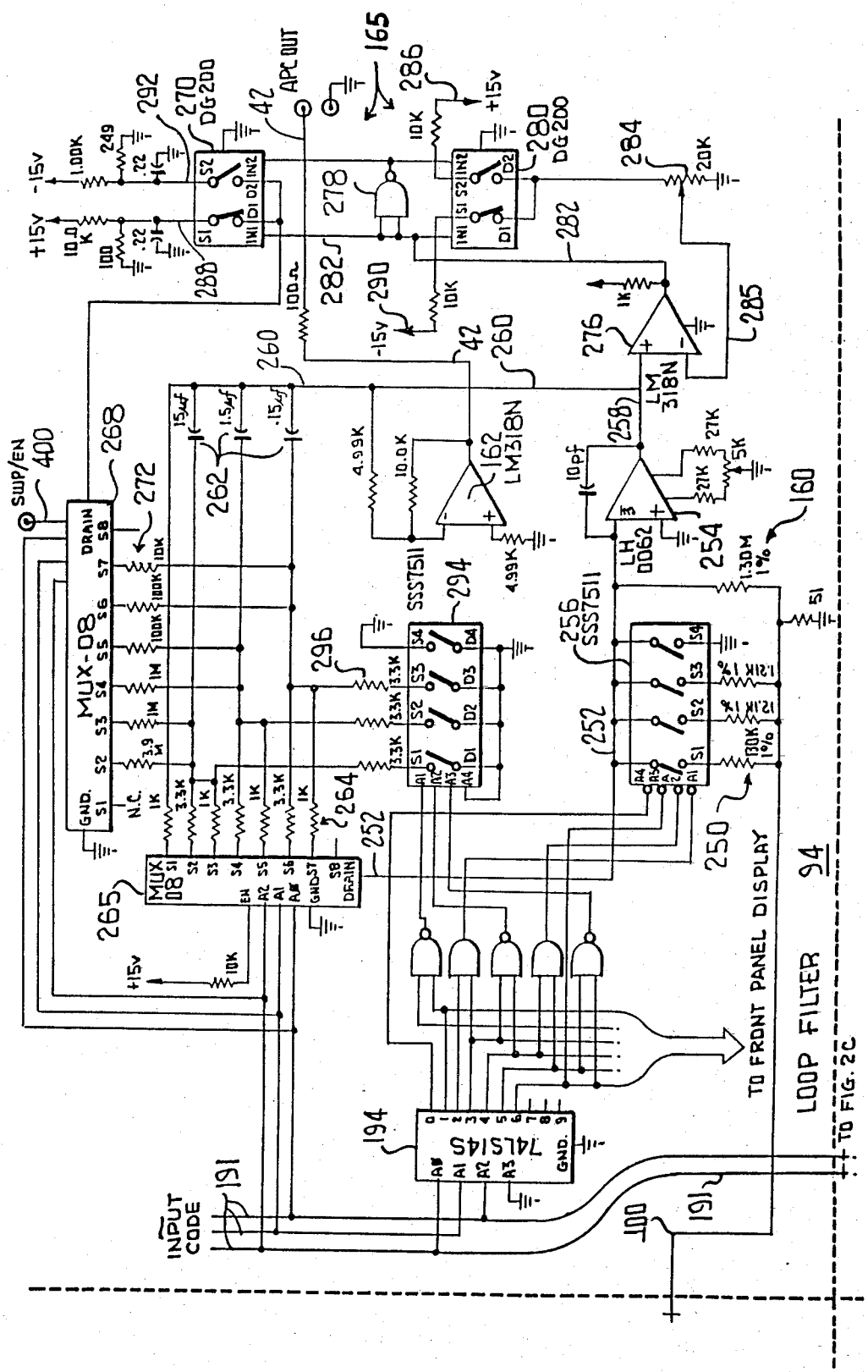

VARIABLE PHASE SIGNAL DEMODULATOR

This is a continuation of application Ser. No. 311,114, filed Oct. 13, 1981 and now abandoned.

BACKGROUND OF THE INVENTION

The present invention relates to a detector of phase modulated signals and, more particularly, to a phase demodulator particularly for use with a telemetry receiver for reception of signals from space and other weak and noisy signal sources.

In recent years, the use of radio links for transmission of data has expanded greatly in such fields as antenna tracking, communication satellites, meteorological satellites and related fields. The increased use of such data links in areas requiring the utmost in system reliability and performance demanded the development of new equipments and techniques to assure reliability of the data extracted from weak noisy signals; signals, for instance, in which the carrier signal is as much as 20 dB below the noise level.

It is essential to demodulation of phase modulated signals to be able to lock the receiver onto the carrier whereby to provide a stable phase reference signal against which the phase modulated signal is to be compared. With carrier levels received from deep space as low as 20 dB below noise, acquisition is difficult to achieve and to hold once achieved. Additionally, the time required to acquire lock is often excessive particularly where narrow bandwidths (30 Hz) are involved and thus the ability to hold lock, once acquired, is critical.

BRIEF DESCRIPTION OF THE INVENTION

In accordance with the present invention, there is provided a phase demodulator for retrieving phase modulated signals having deviations of up to 2.8 radians. Both automatic and manual carrier lock acquisition modes are provided. In the automatic mode, acquisition is symmetrical about the carrier center frequency and at least 90% probability of acquisition of quite weak signals may be achieved. In the event that lock cannot be achieved automatically, the operator may intercede and assume control of the search function.

In achieving the objects of the invention, the phase locked loop of the phase demodulator includes the second local oscillator (LO) of a double conversion superheterodyne receiver. The second LO is controlled to maintain the carrier at the center frequency of the second mixer IF stage. The phase demodulator employs a phase detector to derive a signal indicative of phase error which signal is applied through the phase locked loop filter to control the second LO.

If carrier lock is not achieved or is lost, three different operations are available. In the automatic mode, if lock is lost but the carrier is still detected, an anti-sideband circuit is employed to suppress the sidebands in the phase detector circuit of the loop to provide a strong discriminator action and enhance the ability to reacquire lock on the carrier by variation of the second LO frequency. If both lock and the carrier are lost, the loop filter is utilized to develop a sweep signal which is applied to the second LO to sweep the oscillator over a range which is selected by the operator. Control of demodulator bandwidth by the operator is provided.

The anti-sideband and sweep functions are enabled by a synchronous AM detector utilizing a double-balanced mixer to produce a d.c. signal which is a maximum at carrier lock. Upon loss of carrier lock, the d.c. signal level falls sufficiently to enable the anti-sideband function. If a loss of carrier signal is not present, the anti-sideband circuit is inserted in the phase locked loop to enhance carrier acquisition ability. As indicated above, the anti-sideband circuit is not employed if both loss of carrier and loss of lock signals are present. In this mode, sweep is instituted and continues until a carrier is detected. At this time, the anti-sideband circuit becomes active until lock is detected.

The main function of the synchronous AM detector is to permit detection of carrier signals at as low as 20 dB below noise levels. The detector employs a sinusoidal reference frequency input which is at the same frequency as the reference for the carrier locking loop, the IF and reference signals are phased locked. The signals are applied to a double-balanced mixer, 90° out of phase so that so long as lock is maintained, the IF and reference frequency is balanced out and a d.c. signal directly proportional to the strength of the IF carrier signal is derived. This signal is used in a gain control feedback loop which holds the input level to the AM detector constant. Thus, so long as lock is maintained, the d.c. output from the detector is constant and is employed as the lock indicator signal.

The use of the quadratured IF and reference signals in a double-balanced mixer is to a great extent responsible for the ability of the receiver to detect the carrier in the presence of high noise levels. An additional element of the circuit contributing to this function is the inclusion of an AGC integrator circuit in the gain control loop of the AM detector. The integrator greatly reduces the bandwidth of the circuit by its filtering action and, more specifically, eliminates the upper frequency ranges in which most of the noise resides. The narrow bandwidth of the integrator is permissible since it is desired to detect only the d.c. component of the output of the detector plus relatively slow amplitude variations resulting from signal fading.

In addition to the above functions, the synchronous AM detector is utilized to provide an exact reproduction of received AM signals when phase lock is achieved. The output of the double-balanced mixer, as previously indicated, provides an output containing the d.c. lock signal, the AM modulation and noise. To retrieve the AM signal, the d.c. is balanced out and noise filtered out. If lock is lost, the AM signal from the synchronous detector is not valid and the lock signal may be employed elsewhere in the receiver to select an AM envelope detector output in preference to the AM sync detector output.

The anti-sideband circuit includes a phase demodulator, the output of which is applied as negative feedback to the reference signal input to the phase detector. As a result of such action, the sidebands are strongly suppressed. In order to function in the environment of the present invention, the delay through the feedback loop must be minimized. In accordance with the present invention, a delay of approximately only 5 nanoseconds is achieved by employing a comparator type, ECL phase modulator in the feedback loop. A coherent ramp voltage is applied to one input of the comparator and a feedback signal derived from the output of the phase detector is applied to the other input. In consequence, the only delay in the phase modulator circuit is through the comparator. By selecting a comparator with the appropriate delay, the desired time response may be achieved; in the present instance, about 5 nanoseconds.

It is thus an object of the present invention to provide a phase demodulator for use in low signal and noisy environents employing a synchronous AM detector to detect carrier lock at carrier levels as low as 20 dB below noise and to produce from the same circuit, AM signals that are a substantially exact reproduction of the AM input, and an AM source select function also relying on the lock detect function; to control sweep of the second local oscillator of a dual conversion receiver as a function of loss of lock and loss of carrier and to activate a novel fast response anti-sideband circuit in the phase demodulator locking loop in response to loss of lock in the presence of a carrier and to utilize components of the time constant circuit of the phase lock loop, loop filter in a sweep generator for control of the second LO of the receiver when the carrier has been lost.

BRIEF DESCRIPTION OF THE FIGURES

FIGS. 2A-C taken together, constitute a partial block, partial circuit diagram of the phase demodulator of the present invention.

DETAILED DESCRIPTION OF THE PREFERRED EMBODIMENT

Figure 1A:
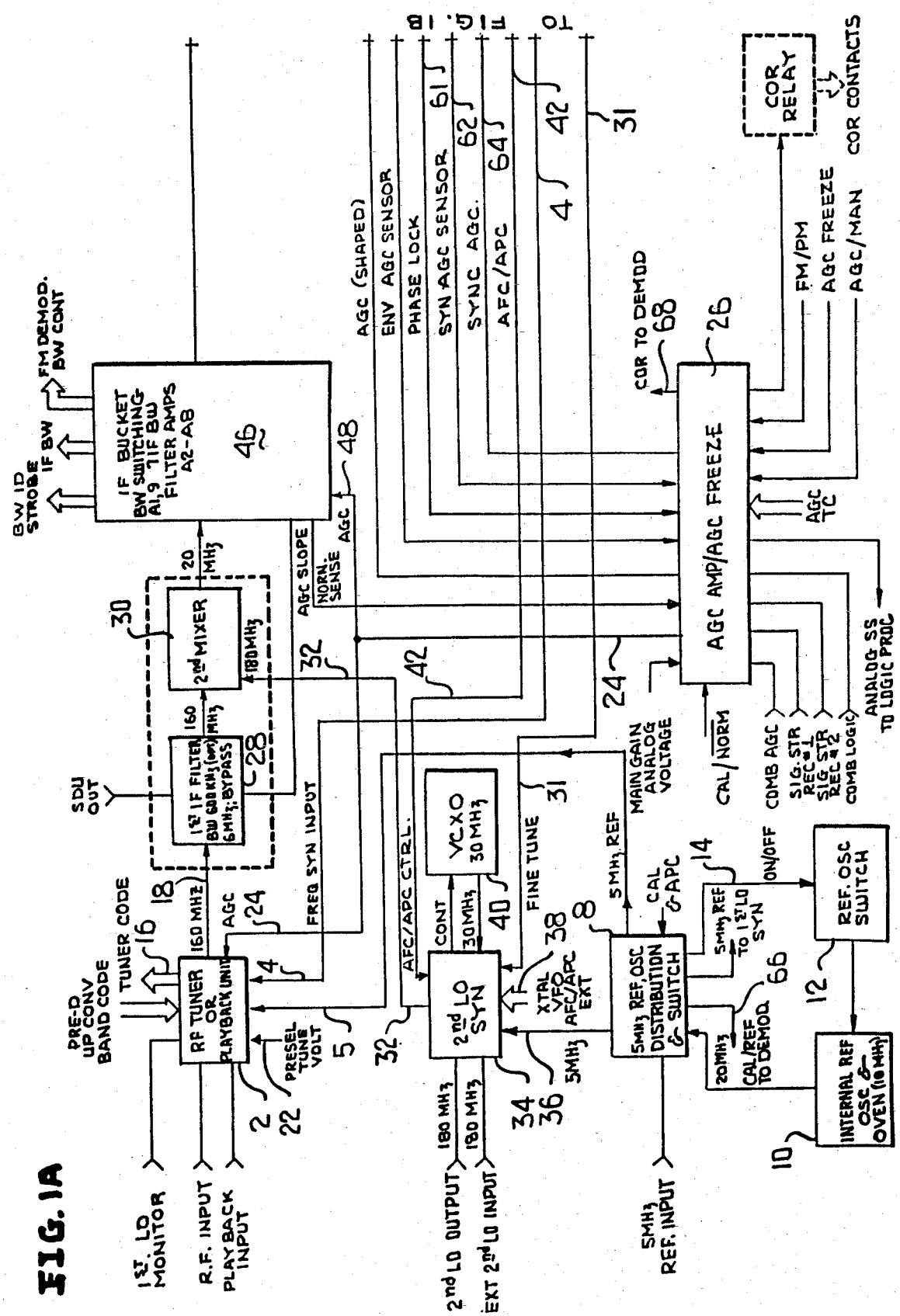
FIGS. 1A-B taken together, constitute a block diagram of a receiver in which the demodulator of the present invention may be employed.
Figure 1B:
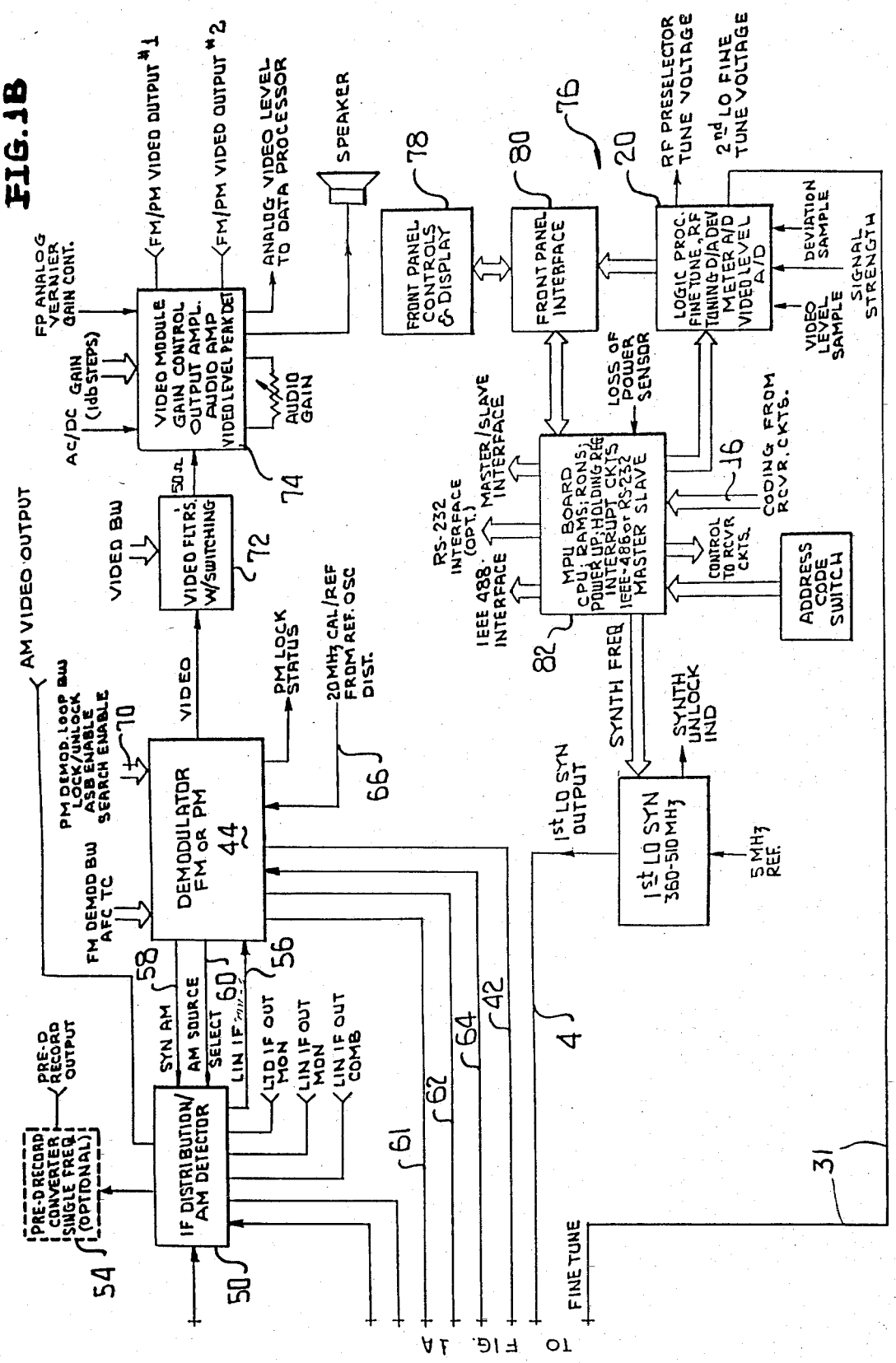

Referring specifically to FIGS. 1A and 1B of the accompanying drawings, there is illustrated a block diagram of a micro-processor-controlled receiver with which the phase demodulator of the present invention may be employed. The receiver is a double conversion superheterodyne apparatus and includes an RF tuner 2 adapted to receive an RF input from an antenna or a playback unit in which an RF signal has previously been recorded. The tuner receives a first local oscillator input signal via a lead 4 from the first local oscillator frequency synthesizer 6. The synthesizer is provided with a 5 MHz reference from a 5 MHz reference oscillator, distributor and switch 8. The distributor and switch 8 may receive a 5 MHz reference input from a highly stable external source or may internally generate the signal utilizing an internal reference oscillator and oven 10. A reference oscillator switch 12 controls the operation of the oscillator 10 in response to a signal received via a lead 14 from the distributor and switch 8.

Returning to the RF tuner 2, a number of tuners covering different discreet frequency ranges are available. Each tuner is adapted to input a code via digital data lead 16 to the MPU to program the first LO synthesizer 6 to operate at the proper frequency to produce a 160 MHz output signal on tuner output lead 18.

In the tuner, the RF input is filtered by a voltage-tuned preselector before mixing with the first LO input to produce the IF signal. The tuning voltage is derived from the logic processing units 20 of the microprocessor circuitry via a lead 22. This voltage is thus a function of the particular tuner plugged into the receiver and, therefore, of the center frequency of its pass band. The tuner also receives an AGC signal via a lead 24 from AGC amplifier and AGC freeze circuit 26.

The IF signal appearing on the lead 18 is applied to a first IF filter 28 which selectively provides 600 KHz, 6MHz and 15 MHz bandwidths as desired. The filtered signal is then applied to a second mixer 30 which receives an appropriate local oscillator input via a lead 32 from a second LO synthesizer 34. The second LO synthesizer 34 receives the same 5 MHz signal applied to the first LO synthesizer 6 via a lead 36 and is programmed for crystal VFO, AFC/APC or external frequency input via a digital data lead 38 from the microprocessor. A voltage controlled crystal oscillator 40 is provided to produce a 30 MHz signal. The automatic frequency control/automatic phase control signal is a frequency or phase control signal from a frequency, phase or phas shift keying demodulator, any one of which may be selectively coupled in as the demodulator of circuit 44. The second LO synthesizer is controlled for locking on a carrier by means of the signal appearing on the lead 43 as will be described in detail since this is one of the features of the present invention.

Returning for the moment to the second LO synthesizer 34, in the VFO mode, a 180 MHz second IF injection signal to a second mixer 30 is derived from a temperature stable voltage controlled oscillator. Fine tune voltages appearing on lead 31 are employed to establish the desired frequency and are derived from the microprocessor. Control of the microprocessor is by means of up/down slew push buttons available to the operator; the microprocessor smoothly increasing or decreasing the fine tuning voltage in response to the operation of the slew buttons. The VCO is also employed in the AFC/APC mode except an additional control voltage must be supplied from the appropriate demodulator as previously indicated, specifically, via the lead 42.

In the crystal position, the second LO signal is derived from the 5 MHz reference signal and is coherent with the first LO signal. Since the IF signal applied to the second mixer is 160 MHz and the input signal is at 180 MHz, the output signal from a second mixer is 20 MHz and it is applied to a second IF filter module 46. Up to seven filters can be mounted in this module with selection controlled either locally or remotely via the microprocessor as a function of receiver bandwidth. An AGC slope signal is applied from the IF filter module 46 to the AGC amplifier and AGC freeze module 26, the filter module receiving an AGC signal via a lead 48, also from the module 26.

The output signal from the filter module 46 is applied to an IF distributor and AM detector 50. A linear IF signal from the distribution portion of the module 50 is applied to a combiner, not illustrated, via a lead 52, is applied optionally to a predetection recorder 54 and via a lead 56 to the demodulator element 44. An AM video output is developed upon a lead 54 from the AM detector. A sync AM signal is provided to the AM detector via a lead 58 and an AM source select signal is also provided to the module 50 via a lead 60. The AM detector includes an envelope detector which provides an envelope AGC signal to the AGC circuit 26 via lead 51; the AGC circuit returning a shaped AGC signal via lead 53. As previously indicated, the PM demodulator includes a synchronous AM detector. The AM source select chooses whether the envelope detector or the sync AM signal will be provided to the AM video output. This function is described in detail with respect to the phase demodulator of the present invention.

The selected demodulator 44 provides phase lock and synchronous AGC sensor signals to the AGC module 26 via leads 61 and 62 respectively and receives a synchronous AGC signal via a lead 64. The synchronous AGC circuitry, although it is included in the module 26, is more appropriately a part of the demodulator processing function and is described in detail in the description of the phase demodulator apparatus of the invention. It should be noted that the demodulator also receives a 20 MHz reference via a lead 66 from the distributor and switch 8 for purposes to be described subsequently. The demodulator also receives a signal on lead 68 from the AGC module 26 indicating whether a signal is present; the COR standing for Carrier Operated Relay. Also, for purposes to be described, the demodulators receive, via digital data leads 70 from the microprocessor, information necessary to determine the loop bandwidth and the anti-sideband enable and search enable control signals. The video output from the demodulator is applied to various video filters and switches within a module 72 and this signal, after appropriate filtering and switching, is provided to the various video and audio output processing circuits contained in a module 74.

The microprocessor which is generally designated by reference numeral 76 allows for local or remote control of the receiver. All controls of the receiver are accomplished by means of the microprocessor which may receive signals from an operator via front panel controls 78 applied via the front panel interface 80 to the MPU 82 of the microprocessor.

Specifically, the microprocessor provides control initiated by the selected RF tuner of the IF and video bandwidths, predetection, record and playback frequencies, video gain, AGC time constants and the frequency and phase demodulator loop bandwidths. It also provides selection of the second LO mode and fine tuning voltage as required. Outputs are also provided to front panel displays and indicators to display the receiver status and mode of operation.

Returning for the moment to the AGC module 26, it has three modes of operation: automatic, manual and freeze. When the FM demodulator is employed, the gain control voltage is derived from the carrier envelope detector and is not coherent. When the PM demodulator is installed as in the present invention, the envelope AGC circuitry functions in the same manner as with respect to the FM, however, within the PM demodulator, a coherent detector is employed to provide synchronous gain control to the input amplifier. This allows for the additional sensitivity inherent in coherent modulation systems. The synchronous AGC voltage is made available to the AGC module 26 where it is summed with the envelope AGC to provide an output proportional to actual input signals. This output is used to drive AGC record and combiner AGC outputs. The receiver gain can be set to a fixed level when manual gain control mode is selected. In the AGC freeze mode, which can be controlled either locally or remotely, the AGC voltage is frozen to the level present when the freeze command is received. This level can be held indefinitely and will hold the receiver gain constant over extended periods of time. This mode is particularly useful in calibrating systems and calculating system noise temperatures.

Figure 2C:
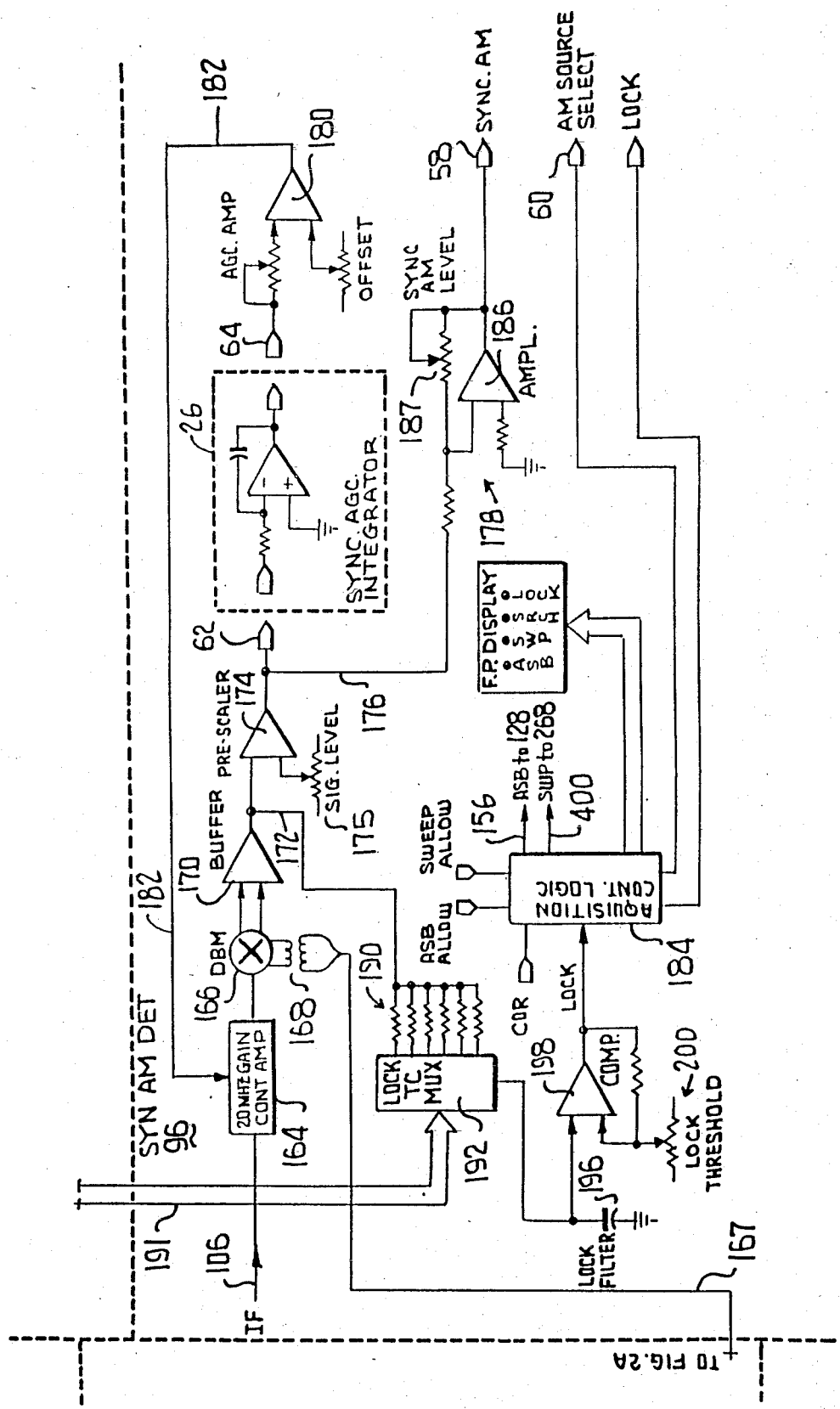

Referring now specifically to FIGS. 2A to 2C of the accompanying drawings, there is illustrated a block diagram of the phase modulated signal demodulator. The demodulator is basically made up of four blocks separated by dashed lines and designated by reference numerals 90, 92, 94 and 96. Within the block 90, is located two phase detectors, one providing the video output information from the demodulator on a lead 98, and the other demodulator providing a video output via lead 100 to the loop filter 94 from which the automatic phase control signal to the second local oscillator 34 is derived. Block 92 contains a 20 MHz distribution system and ramp generator—the latter providing a ramp voltage to a phase demodulator for sideband suppression in the phase demodulator providing the video output to the loop filters for purposes to be described.

The IF signal is also provided to a synchronous AM detector located within the block 96 which also receives a 20 MHz reference input sine wave from the distribution block 92 to provide a synchronous AM output, the AM source select output, and the lock signal for use in carrier acquisition control circuits and in a diversity combiner if such is employed.

Referring now specifically to the phase detector block 90, the IF signal on lead 56 from the IF distributor and AM detector 50 of FIGS. 1A and 1B is applied to a signal splitter 102. Half the signal, roughly, is applied to a limiter 104 of the information phase detector circuit and the other half provides an IF signal on lead 106 to the synchronous AM detector 96. The output of the limiter 104 is supplied to a one-shot multi-vibrator 108 providing one input to a phase detector flip flop 110. A second input to the phase detector flip flop 110 is derived from a second one-shot multi-vibrator 112 supplied with a 20 MHz reference input via lead 114 and line receiver 116 from the 20 MHz reference signal distributor 92. The flip flop 110, which is the phase detector, is a set-reset type of detector and must be provided with pulses for proper operation; thus the use of the one-shots 108 and 112. Both of the signals supplied to the one-shots are also squared up by means of the limiter 104 in the IF signal path and a limiter 118 located between the input leads 66 of the 20 MHz reference sine wave signal and the lead 114 through various circuits which are self-evident. The limiter is driven from a power amplifier 117 to provide sufficient energy to drive multiple circuits. The output of the flip flop 110 is fed to an amplifier 111 to control balance of the output square waves relative to ground. The signals then pass through a buffer 113 and a low-pass filter 115 to reproduce the video signal on the lead 98.

It will be noted that the reference distribution circuit employs a tapped delay line designated by reference numeral 119. The delay line has ten taps offset by 5 nanoseconds and provides great flexibility in setting appropriate phase relations in the system.

In receivers for use with very weak signals, it is often quite difficult to acquire lock on the carrier or in some instances, to detect the carrier. However, once the carrier has been detected, the lock is not always easily achieved. Specifically, due to the weak level of the carrier, the system may well lock on a side band rather than on the carrier or IF center frequency; phase lock to the carrier being necessary to obtain coherent detection.

In order to enhance the ability of the system to lock onto the carrier rather than the side bands, an anti-side band or side band suppression circuit is utilized. Specifically, the IF signal from limiter 104 is tapped off via a lead 120 and is applied to a one-shot multi-vibrator 122, the output of which is provided to a second phase detector flip flop 124. The phase detector flip flop 124 is driven by another one-shot multi-vibrator 126 which can receive signals via an ECL switch 128 either from the 20 MHz reference input lead 66 or from a feedback loop originating in the output circuit of the phase detector flip flop 124. Specifically, the output of the flip flop 124 is fed to a differential amplifier 130 that supplies its single ended output to a signal splitter 132 via buffer 134. One output of the signal splitter 132 is applied to a lead 136 in the aforesaid feedback loop, the lead 136 being applied through a potentiometer 138 to one input of a comparator amplifier 140. The other input to the comparator amplifier is supplied via a lead 142 to which is applied a ramp voltage from a ramp voltage generator generally designated by the reference numeral 144. The reason for the utilization of a ramp voltage in conjunction with the particular feedback circuit including the comparator 140 is to eliminate time delay in the modulation circuit. In typical modulation removal circuits of the prior art, delays as great as 500 nanoseconds are customery whereas in the circuit illustrated in FIGS. 2A to 2C the delay is as little as 5 nanoseconds. The reason for this short delay is that the feedback has no time delay as such—there is no time delay from the ramp voltage generator 144 or from the splitter 132 through potentiometer 138 to the comparator. The comparator simply detects the level of the ramp voltage at which the feedback level exceeds it and provide its output through the ECL switch to trigger the one-shot multi-vibrator 126. Thus, the only delay in this modulation circuit is in the comparator which, as indicated above, is about 5 nanoseconds. The particular comparator employed is an SP9687.

It is believed apparent that in order for the phase feedback information to truly remove the side bands, the delay through the feedback loop must be very small or otherwise the information is misaligned and fails to provide side band removal.

A second output derived from the splitter 132 is applied via a low-pass filter 146 to the loop filter 94 via lead 100 for purposes to be described subsequently.

The ramp voltage generator is a relatively simple device. It is synchronized from the lead 66 via a one-shot 148 to a discharge switch 150. A constant current source 152 charges an integrating capacitor 154 to a maximum level determined by clamp 156 on each cycle of the one-shot 148. The capacitor 154 is discharged relatively rapidly and then recharges along a slope determined by the current source. Thus, the 20 MHz reference input signal synchronizes the ramp and the current source and clamp determine the ramp slope which must be appropriately tailored to the characteristics of the comparator 140 and the firing level of the one-shot 126.

Whenever the anti-side band control, which appears on lead 156A, indicates that the second local oscillator is locked onto the carrier, the anti-side band signal causes the ECL switch to receive the 20 MHz reference input signal via limiter 118, delay line 119, driver 120, lead 401 and line receiver 158 so that the side band suppression is not employed as will become apparent from the description of the interrelationship of the modules 94 and 96, the loop filter and the synchronous AM detector, respectively.

The signal on the lead 100 which is supplied to the loop filter 94 has a d.c. component of zero when the receiver is locked onto the carrier. The signal is applied to an integrator generally designated by the reference numeral 160. The d.c. level from the integrator 160 is passed through an invertor 162 via leads 258 and 260 and is applied to the second local oscillator control to control its frequency as a function of lock or failure of lock. Specifically, when lock is detected by circuits, to be described subsequently, and the ECL applies the signal from the line receiver 158 to the one-shot 126, the output d.c. level on lead 100 is at zero and the output control signal to the second local oscillator appearing on lead 42 is such that the frequency of the second local oscillator is maintained unvaried. If, however, lock is lost, the signal on the lead 100 departs from zero and the voltage on the lead 42 varies so as to change the second local oscillator frequency in a direction to cause it to move towards carrier lock. At the same time, if the carrier is still detected in the system, specifically, the AGC circuit 26 of FIG. 1; the anti-side band signal appears on the lead 156 and causes anti-side band suppression so that the local oscillator in its search mode will not lock onto a side band. If the carrier is lost totally, then a search routine is instituted with the second local oscillator, the oscillator being swept by a sweep generator generally designated by the reference numeral 165 and which will be explained in detail subsequently. At this time it is sufficient to say that upon a loss of lock, but detection of a carrier, a signal appears on lead 42 to cause the second local oscillator to attempt to recapture a carrier and at the same time, the anti-side band circuit is brought into play. If the carrier is lost, the anti-side band circuit is disabled, and the sweep circuit is employed to sweep the second local oscillator in an effort to locate the carrier.

To fully understand the operation of the loop filter and the interrelationship of the anti-side band and sweep circuits, the operation of the synchronous AM detector must be considered, this being the element 96 illustrated in FIG. 2C. The purpose of a synchronous AM detector 96 is to provide a synchronous AM signal which is an exact reproduction of the AM on the IF carrier. This signal is used whenever carrier lock is indicated, otherwise an envelope detector is employed. The synchronous AM detector has the ability to detect signals in an environment in which the carrier-to-noise ratio is as low as minus 20 dB. The synchronous AM detector is also employed to generate an AM source select which, in a sense, is a lock indication, so that whenever the second local oscillator is locked onto the carrier, the AM source select causes the AM detector to select the synchronous AM output rather than envelope AM output. Additional signals generated by the synchronous AM detector are the anti-side band enable and the sweep enable signals via acquisition control logic 184. These signals are employed to control the anti-side band circuit, more particularly, by application to the ECL switch 128 in the feedback loop of the phase detector, and the sweep circuit 165 in the loop filter 94 to initiate sweep of the second LO whenever a carrier is lost.

A major feature of the synchronous AM detector is its ability to discern signals where the carrier-to-noise ratio is as low as minus 20 dB. The circuit for permitting such operation is now described.

Referring again to FIGS. 2A to 2C, the signal on lead 106 from the signal splitter 102 is applied to a 20 MHz gain controlled amplifier 164. The output from the amplifier 164 is applied to one input of a double-balanced mixer 166 which receives a sinusoidal input from the 20 MHz reference input signal on lead 66 via amplifier 117 and a lead 167 to a transformer 168. The output of the double-balanced mixer is applied to a buffer amplifier 170, the output of which is split into two paths, one appearing on a lead 172 and the other going to a prescaler 174. The output of the prescaler 174 is also split, a signal appearing on a lead 176 to a synchronous AM level control amplifier 178 and the other signal being applied to the synchronous AGC integrator 26 via one of the leads 62 and being returned to the demodulator via the lead 64. The signal of lead 64 is applied to an AGC amplifier 180 which applies signal via lead 182 to control the gain of the amplifier 164.

The signals applied from the 20 MHz gain control amplifier 164 and from the transformer 168 are of the same frequency and 90° out of phase, thus permitting the mixer 166 to operate as a coherent detector. It must be realized that the information which is transmitted from the transmitter is coherent and in order to maximize the recovery of information particularly in a very noisy situation, it is found that if the double-balanced mixer 166 is operated with coherent signals, maximum recovery is achieved. The 90° phase between the two signals is achieved by locking the loop to the carrier, i.e. the 20 MHz IF signal with all elements of the receiver locked to the 5 MHz reference oscillator 8 which generates the 20 MHz calibration reference via lead 66 to the demodulator under consideration.

Whenever the receiver is locked on the carrier, a high level d.c. is produced at the output of the double-balanced modulator 166 which is directly proportional to the carrier level. Since the receiver is locked to the carrier, the synchronous AGC integrator may utilize a narrow bandwidth, low-pass filter so as to eliminate the higher frequencies in which most of the noise of the system resides. Specifically, the bandwidth need be only great enough to pass the amplitude fade frequencies. In consequence, the signal applied to the amplifier 164 is a d.c. signal with little noise which will remain at a constant level so long as the receiver is locked onto the carrier. Thus, with a constant level input to the double-balanced mixer from the amplifier 164 and the signal applied via the transformer 168 being at a constant level, a constant level d.c. is achieved at the output of the buffer 170. Maximum d.c. output from the buffer 170 indicates carrier lock and it is necessary that the gain of the amplifier 164 not be changed. Such operation can be achieved only if no d.c. signal is applied to the AGC integrator circuit. The prescaler 174 is employed to eliminate the d.c. on lead 62 in such circumstances; a potentiometer 175 providing an input d.c. level equal to the prescaler d.c. level at carrier lock. In consequence, at lock, only a.c. and noise appear on the lead 62.

The signal on lead 176 is the synchronous AM signal plus noise and it is applied to the lead 58 via buffer amplifier 186 which sets the synchronous AM level video by means of feedback potentiometer 187.

Referring now to the AM source select signal to be developed on the lead 60, the anti-side band signal on lead 156 and the sweep signal on lead 400, the signal appearing on the lead 172 contains d.c. and a.c. components with the d.c. directly related to the lock or the lock function. In order to eliminate the a.c. and to look only at the d.c. components for determining lock, a noise filter is utilized in the circuit. The filter comprises a capacitor 196 and a group of resistors 190, one of which is selected by the lock time constant mux control 192. Control of the element 192 is effected from the microprocessor via lead 191. One resistor of the group of resistors 190 is selected as a function of the loop bandwidth. This resistor is placed in series to ground with the capacitor 196 with a tap to a comparator amplifier 198 having one input connected between the selected resistor 190 and the integrating capacitor 196. The circuit is such as to filer out the noise and leave only the d.c. component stored in the capacitor 196. The comparator 198, through its lock threshold adjustment 200, determines the level at which the system recognizes that carrier lock has been achieved.

The output of the comparator 198 is applied to the acquisition control module 184 and if lock is detected, an appropriate signal appears on the lead 60 to cause the a.m. signal utilized by the receiver to be the synchronous a.m. signal appearing on lead 58; this function occurring elsewhere in the receiver.

Figure 3A:
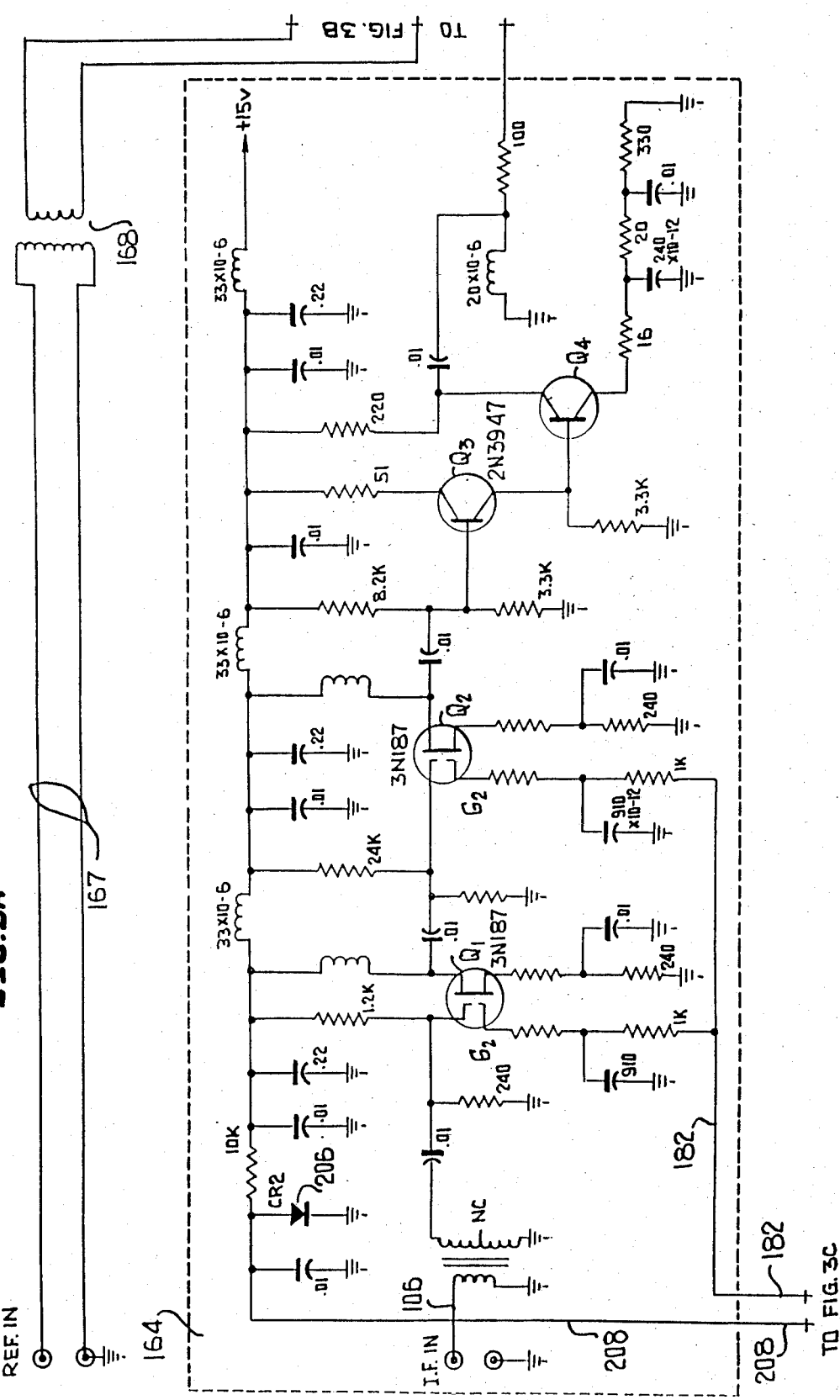
FIG. 3A-C is a circuit diagram of the synchronous AM detector of the present invention.
Figure 3B:
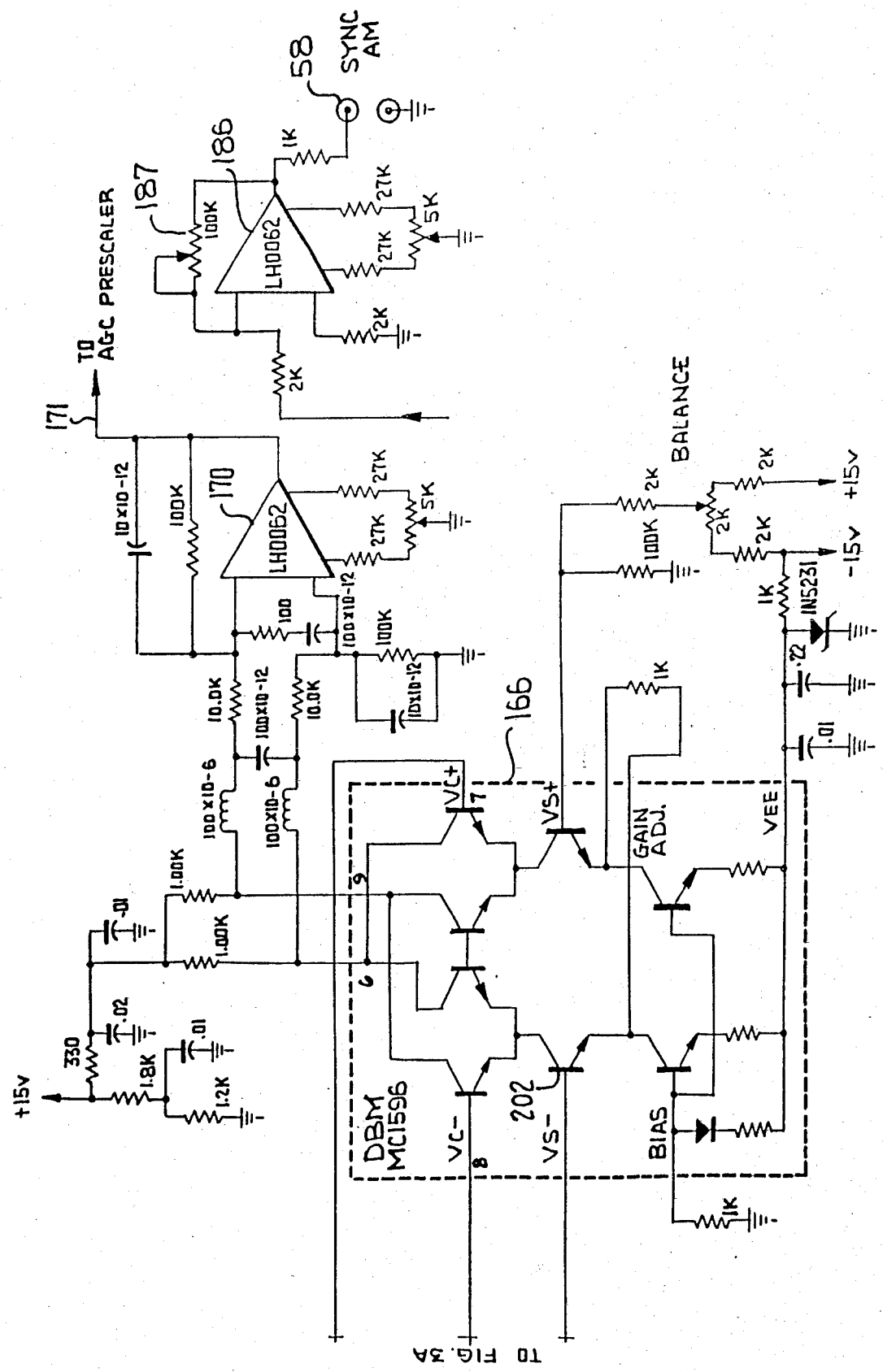
Figure 3C:
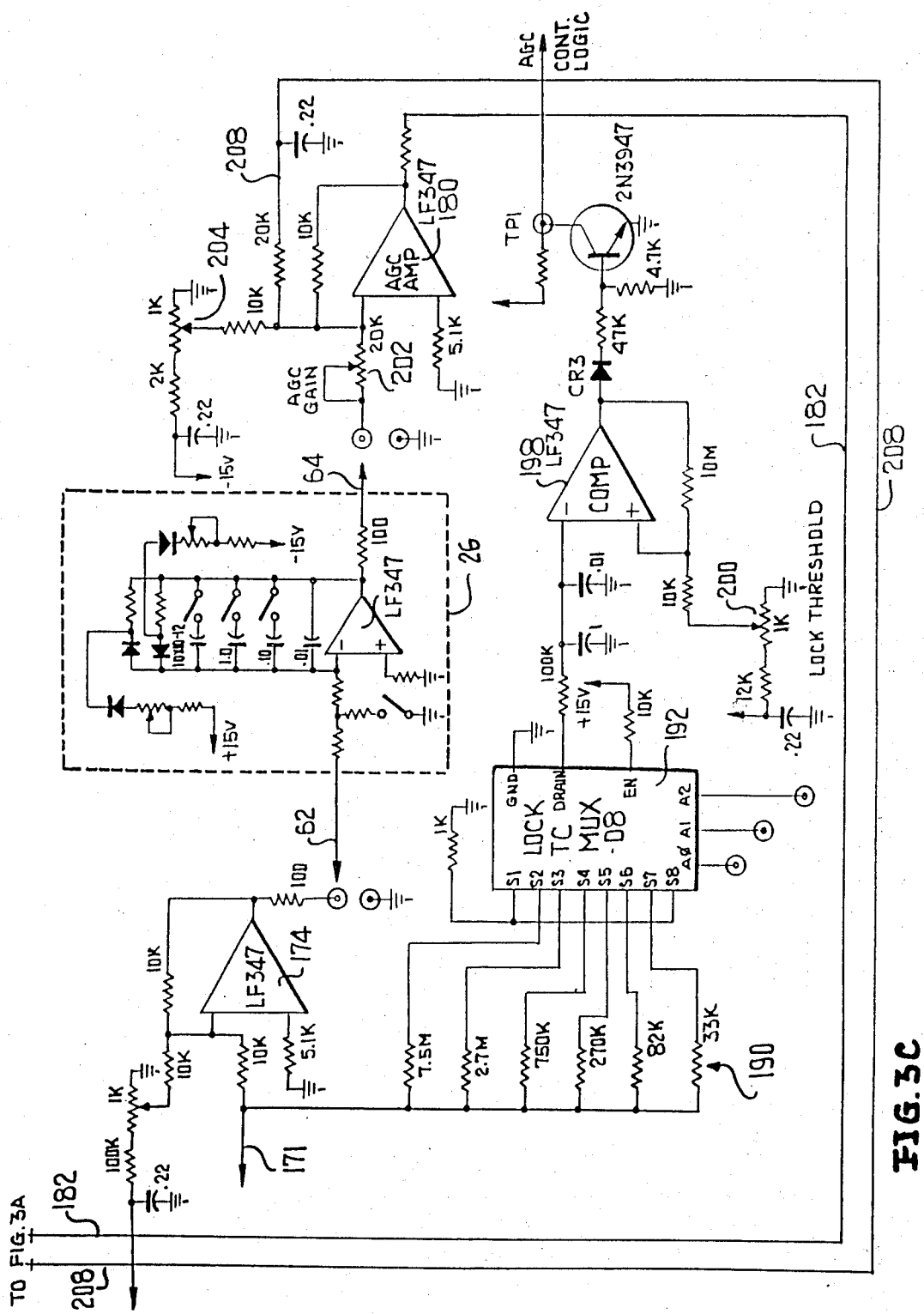
Figure 4:
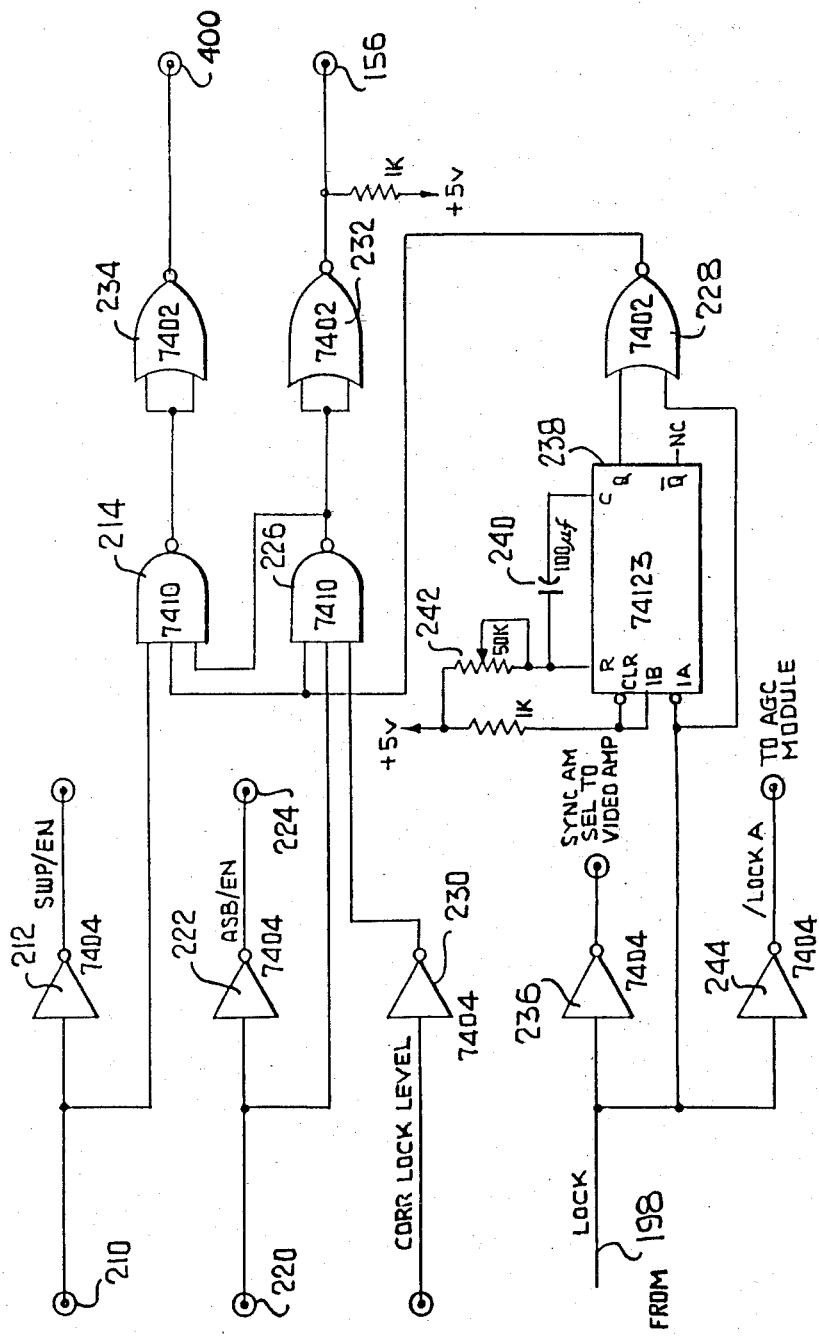
FIG. 4 is a circuit diagram of the acquisition control logic associated with the synchronous AM detector of the invention.

Referring now specifically to FIGS. 3A to 3C of the accompanying drawings, there is illustrated the circuit diagram of the synchronous a.m. detector except for the acquisition control logic circuitry which is illustrated in FIG. 4 of the drawings. Basically, the circuits of FIGS. 3A to 3C follow the block diagram of FIGS. 2A to 2C very closely. The AGC gain controlled IF amplifier 164 constituting amplifiers Q1, Q2, Q3, and Q4 providing output to a transistor 202 in the double-balanced mixer 166 which constitutes a Motorola MC1596G. The other input to the double-balanced mixer is provided from the transformer 168 to pins 7 and 8 of the double balanced mixer 166. The balanced output from the mixer 166 appears on pins 6 and 9 and is supplied to the buffer 170 and from the buffer 170 to the AGC prescaler 174. The signal is also applied to the group of resistors 190 with the particular resister instead in circuit with the capacitor 196 being selected by the lock TC MUX 192, this being a MUX 08 of the PMI Company. The output of the prescaler 174 is applied via lead 62 to the AGC integrator 178 which supplies an output signal via lead 64 to the AGC amplifier 80. It should be noted that the AGC gain is controlled by a potentiometer 202 in series with pin 2 input to the amplifier 180 and that the AGC offset or zero level control 204 is connected between the potentiometer 202 and the pin 2.

The output from the AGC amp is applied again via lead 182 to control the gain of the amplifier 164, being applied to terminal G-2 of the amplifiers Q1 & Q2. A temperature-sensitive diode 206 is physically situated near Q1 and Q2 and provides, via a lead 208, a temperature compensating signal to the AGC gain amplifier 180.

The output fo the prescaler 174, in additin to being applied to the AGC integrator 178, is applied to the sync AM level amplifier 186 having the sync AM level control potentiometer 187 associated therewith.

Referring now to FIG. 4 of the accompanying drawings, there is illustrated the circuit diagram of the acquisition control logic circuit 184 of FIG. 2C. The sweep enable signal is applied to terminal 210, to an inverter 212 and also to one input of a NOT-gate 214. The anti-side band enable signal is applied to a terminal 220 and through an inverter 222 to provide an anti-side band indicator signal on the terminal 224. The terminal 220 also applies voltage to one input of a second NOT-gate 226. The gate 214 also receives input signals from the output fo the gate 226 and from a NOR-gate 228 whose functions will be subsequently described. The NOT-gate 226 also receives input from NOR-gate 228 and receives a further input from the carrier-operated relay via an inverter 230.

If the receiver is locked on the carrier, a "0" signal is applied to inverter 230 whereas if the signal is low indicating loss of lock, a "1" is applied to the input to 230. It is apparent that the anti-sideband enable signal takes precedent over the sweep enable signal. Thus, if a carrier is present, but a lock has not occurred, an anti-sideband signal is developed on the output of the NOT-gate 226 and is applied via NOR-gate 232 to the anti-sideband lead 156 which in FIG. 2A is connected to the ECL switch 128. In the event that there is a loss of carrier and a loss of lock both, as will become apparent, then the antisideband circuit is disabled by the output from the inverter 230 and the sweep signal is developed on lead 400.

The NOR-gate 228 produces an output signal when a lock signal is present, the signal disabling both the sweep and the anti-sideband circuits. When the lock signal is lost, then the output from the gate to 228 disappears and then both of the NOT-gates 214 and 226 are rendered enabled even though only one or other can actually pass a signal at the same time due to the interlock between the gate 226 to the gate 214.

It is imperative that the lock signal not disappear immediately if there is just a temporary loss of signal and also, that the signal not be generated immediately so that if the system detects a sideband, the lock signal will not appear immediately. The former function; i.e. maintaining the lock signal for a prescribed time period, is achieved by time circuit 238, a TI-74123. The signal on lead 198 is applied to the time circuit 238 having a 100 μf timing capacitor 240. The time constant of the circuit is determined by the capacitor 240 in conjunction with potentiometer 242; the desired time constant being a function of the bandwidth of the system.

The circuit for delaying generation of a lock signal constitutes basically the resistors 190, MUX 192 and capacitor 196 which establish a timing delay at the input to the acquisition control circuit 184 such that the second LO is swept past a side band from whatever side it is approaching the carrier and a lock signal is not generated until a sufficient time later such that the far larger carrier lock signal has an opportunity to be generated and assumes control, forcing the second local oscillator to home in on the carrier. The anti-side band circuit, of course, assists in this since when a carrier is detected, the anti-side band circuit becomes effective providing a strong discriminator action against the side bands in favor of the carrier. The AGC lock signal appearing on lead 62, FIGS. 1 and 1B to the AGC module is also drawn from the lead 198 via an inverter 244.

Referring now specifically to the loop filter 94, FIG. 2B, as previously indicated, it is the function of the loop filter to provide a control voltage for the second LO oscillator on a lead 42; the voltage being employed to tune the second LO so that the carrier frequency falls at the center of the IF band of the receiver. The output on the lead 100 is applied selectively through one of a group of resistors 250 to an input lead 252 to the integrator-amplifier 254. The selection of the resistor of the group of resistors 250 is effected by a MUX 256 which is under the same control as the time constant lock MUX 192 of the sync AM detector 96. The selected resistor 250 is connected to pin 3 of an integrator-amplifier 254. The output of the integrator-amplifier 254 appears on a lead 258 and is applied through inverter 162 to the lead 42 to control the second local oscillator frequency.

The signal appearing on the lead 258 is also applied via lead 260 to a group of capacitors 262, three of which are illustrated. These capacitors are selectively coupled through one of a group of six resistors 264 to the lead 252. Selection of the specific resistor 264 is under control of MUX 265. The MUXES employed in this circuit, as well as the sync AM detector circuit 96 are MUX 08 of PMI. The MUX 265 also selects one of the capacitors 262, each of the capacitors 262 being paired with one of two associated resistors 264. Thus, the two MUXES 256 and 265 permit the selection of one of three capacitors and two of twelve different resistors to provide flexibility in the selection of the time constant of the integrator; which time constant is selected as a function of the bandwidth of the receiver.

The loop filter serves the conventional function of any loop filter in a phase lock loop; the loop consisting of the phase detector, the loop filter and the second LO whereby the second LO is tuned to cause the carrier to be located in the middle of the IF band. In this respect, the loop filter 94 serves the conventional function of a loop filter in a phase lock loop. One important feature of the loop filter in the present invention is its tunability so that the time constant of the filter can always be matched to the bandwidth of the receiver arrangement currently being employed. The loop filter of the present invention, however, also serves as the sweep oscillator when the apparatus is put into the search mode in order to reacquire a carrier or when first turned on to acquire a carrier. Specifically, the loop filter is provided with a MUX sweep control or enable 268 which receives a sweep current from a FET switch 270 and applies the sweep voltage through one of six different selectable resistors 272 to the resistors 264 and capacitors 262. The Sweep MUX 268 is programmed at the same time that all of the other MUXES of the PM demodulator are programmed for a specific loop bandwidth being employed. The sweep current appears on the input to the integrator-amplifier 254 to provide a sweep voltage output to the second LO causing the second LO to search for a carrier and to cause the second LO to lock onto the carrier when it is detected. In this sequence, there first is a sweep sequence, when a carrier is detected, the sweep is disabled and the anti-side band circuit is enabled and when lock occurs, the anti-side band is disabled and the voltage on the lead 252, the input of the integrator, will fall to "0".

The ramp voltage is generated by a ramp voltage generator generally designated by the reference numeral 165 comprising a comparator 276 which receives an input from the lead 258 and inverter-amplifier 278 which receives the output from the comparator 276. FET swtiches 270 and 280 receive first control inputs from comparator 276 over lead 282, and second control inputs from the output of inverter 278. The potentiometer 284 controls the sweep range of the generator by determining the length of time that the comparator 276 permits the FET switch 270 to be switched into one position or another. Specifically, the ramp generator is controlled for a 20-1 ratio, i.e. the ramp-up time is twenty times longer than the ramp-down time. The voltage at the output of the integrator-amplifier 254 is applied to the comparator 276 where it is compared with a sweep range voltage appearing on the lead 285. Initially, the FET switch 280, at the beginning of an up ramp, would be in the position where a positive voltage appearing on terminal 286 is applied to sweep range potentiometer 284. the voltage on the lead 282 will cause the FET switch 270 to switch so that the voltage on negative voltage terminal 292 is applied to the sweep MUX 268. As the voltage on the lead 260 rises, it will eventually equal the voltage on the sweep range potentiometer 284 causing the FET switch 280 to switch in the voltage appearing on negative voltage terminal 290 and concurrently, the voltage on the lead 282 cause the FET switch 270 to switch to the positive voltage appearing on lead 288. The charge on selected capacitor 262 falls until the output of the integrator-amplifier 254 equals the negative voltage appearing on the resistor 284 at which time the cycle reverses and the ramp function is again initiated. It should be noted that the ratio of ramp-up or ramp-down time is approximately 20-1.

One other feature of the loop filter is the precharged MUX arrangement utilizing a MUX 294 which is also programmed with the other MUXES for a specific bandwidth of the demodulator configuration being utilized. The function of the precharged MUX is to switch in one of three resistors 296 so that the two unselected capacitors 262 are maintained at the charge level of the signal appearing on the lead 260. The specific reason for this function is to that once a capacitor that has previously not been in the circuit is switched in, there is no time lost in charging that capacitor to the integrator-amplifier output voltage. With very narrow bandwidths such as a 30 Hz bandwidth, the charge time for a capacitor could be several seconds. Thus, it is necessary to maintain the capacitors charged at all times and this is accomplished by connecting the unselected capacitors to ground through the selected resistors, two in this case, one for each of the unselected capacitors. Thus, voltage appearing at the output of the integrator-amplifier 254 is established across all three of the capacitors.

Once given the above disclosure, many other features, modifications and improvements will become apparent to the skilled artisan. Such other modifications, features and improvements are, therefore, considered a part of this invention, the scope of which is to be determined by the following claims.

I claim:

1. In a system for detecting information from sources transmitting the information over different bandwidths, a phase locked loop for locking a local oscillator at the same frequency as an information bearing carrier signal, having side bands comprising a phase detector receiving the carrier signal and a reference signal at the frequency of said local oscillator to produce an output signal indicative of the phase difference between the carrier and the reference signals, an integrator receiving the output signal from said phase detector, said integrator including active and passive elements for establishing the time constant of said integrator, means for changing the time constant of said integrator to select the bandwidth of the system to conform to the bandwidth of the information, means for varying the frequency of the local oscillator as a function of the output signal from said integrator to minimize the phase difference between the carrier and the reference signal, means applying the integrator output signal to said means for varying, means for detecting a loss of the carrier signal, and producing a further signal indicating any of such loss of signal, and means responsive to said further signal, and including said active and passive elements for sweeping the frequency of said local oscillator through prescribed limits upon detection of a loss of carrier signal.

2. The system according to claim 1 wherein said active and passive elements comprise a plurality of resistors and capacitors, and wherein said means for changing the time constant of said integrator comprises means for selecting one of a multiplicity of combinations of different values of said capacitors and resistors as a function of the bandwidth of the information.

3. The system according to claim 2 wherein said means for sweeping the frequency of said local oscillator comprises a source of current, a second plurality of resistors, means for connecting said source of current to a capacitor selected by said means for selecting to charge said capacitor through one of said second plurality of resistors having a value such as to provide a charging rate appropriate to the bandwidth of the system, and means for discharging said selected capacitor upon the voltage thereacross achieving a preselected level to a second predetermined level of voltage.

4. The system according to claims 2 or 3 further comprising means for maintaining the capacitors not selected charged to the same potential as said selected capacitor.

5. The system according to claim 1 further comprising an anti-side band circuit for suppressing said side bands comprising a phase modulator including a generator for generating a ramp voltage at said reference signal frequency, a comparator amplifier for receiving said ramp voltage and a feedback signal derived from said output signal from said phase detector, and means for applying the signal produced by said comparator to said phase detector as said reference signal input to said phase detector.

6. The system according to claim 1 further comprising means responsive to the presence of said further signal and to detection of a carrier signal for selectively suppressing the side bands at the output of said phase detector.

7. The system according to claim 6 including a synchronous AM detector for producing a signal indicative of loss of lock between said carrier and said local oscillator, comprising a double balanced mixer having an output circuit, means supplying the carrier signal applied to said phase detector to said double balanced mixer, means for generating an a.c. signal at the frequency of said reference signal, means for applying said a.c. signal in phase quadrature with the carrier signal to said double balanced mixer whereby to produce at the output circuit of said double balanced mixer a d.c. signal maximum upon phase lock between the carrier and the a.c. signals.

8. The system according to claim 7 further comprising means for enabling said means for selectively suppressing said means for enabling being responsive to said d.c. signal.

9. The system according to claim 8 wherein said means for enabling comprises a lock detector including a noise filter, said noise filter having a fixed capacitor value and various values of resistors, and means for selecting values of said resistors to provide a time constant for the noise filter compatible with the selected bandwidth of the system.

10. The system according to claim 7 wherein said synchronous AM detector further comprises means for producing a gain control feedback signal by balancing out said d.c. signal indicating phase lock of the carrier and reference signals, means for passing the gain control feedback signal through a low-pass filter to eliminate frequencies generally above those produced by carrier drift to produce an AGC signal, and means employing the AGC signal to maintain the level of the carrier signal to said double balanced mixer constant.

11. A synchronous AM detector comprising means for generating a local reference signal, an information containing carrier signal having the same frequency as and in phase quadrature with the reference signal, a double balanced mixer, means for applying said signals to said doublebalanced mixer to produce an output signal, means for eliminating a d.c. component of said output signal of a value indicating phase quadrature of the signals, a low-pass filter receiving the output signal from said means for eliminating, said filter having an upper frequency limit generally equal to the maximum modulated frequency of the carrier, and means responsive to an output signal from said low-pass filter to maintain the carrier signal applied to said double-balanced mixer at a substantially constant level.

12. A control system for a phase locked loop, said phase locked loop comprising a phase detector and a loop filter, a source of phase modulated carrier signals applied to said phase detector, a local oscillator for generating reference signals at the frequency of said carrier signals, and means for reducing the strength of the side band signals at the output of the phase detector, said control system comprising, a synchronous a.m. detector including means responsive to said carrier and said reference signals for providing a first signal when said carrier is not present, and for generating a second signal when said local oscillator frequency is different from the carrier signal frequency, means responsive to the presence of said first signal for causing the frequency of said local oscillator to be swept over a predetermined range, and means responsive to the presence of said second signal and the absence of said first signal to activate said means for reducing the strength of the side band signals at the output of said phase detector.

13. A loop filter for a phase locked loop for use in a variable bandwidth system comprising an integrator comprising a plurality of resistors and capacitors of different values, first means for selectively causing said integrator to produce a ramp voltage output, second means for selecting a combination of resistors and capacitors to provide an integrator time constant compatible with a selected system bandwidth, and the amplitude of the ramp voltage, and said first means including further means for sequentially and successively at a fixed rate applying voltages of opposite polarities across a capacitor selected by said means for selecting.

14. A loop filter for a phase locked loop for use in a variable bandwidth system comprising an integrator comprising a plurality of resistors and capacitors of different values, means for selecting a combination of resistors and capacitors to provide an integrator time constant compatible with a selected system bandwidth, and means for maintaining the unselected capacitors at the same charge as the selected capacitors.

15. In a receiver for phase modulated signals including a phase detector for detecting the difference in phase between a carrier signal and a locally generated reference signal and a phase locked loop, wherein upon loss of lock of the loop on a phase modulated signal, the side bands of the modulated signal are to be suppressed, a means for suppressing the side bands comprising, said phase detector for receiving a phase modulated signal and said reference signal and producing an output signal indicative of the phase difference between the modulated signal and said reference signal, a phase modulator including a ramp voltage generator for producing a ramp voltage at said reference signal frequency, a comparator amplifier for receiving the ramp voltage and a feedback signal derived from said output signal to produce an output signal whenever the feedback signal exceeds the ramp signal, and means for applying the signal produced by said comparator amplifier to said phase detector as said reference signal input to said phase detector.

* * * * *